United States Patent
Motoyoshi et al.

(10) Patent No.: US 7,554,784 B2
(45) Date of Patent: Jun. 30, 2009

(54) SURGE DETECTION CIRCUIT

(75) Inventors: Toshiro Motoyoshi, Kasugai (JP); Kazunori Nishizono, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 363 days.

(21) Appl. No.: 11/449,701

(22) Filed: Jun. 9, 2006

(65) Prior Publication Data

US 2007/0183113 A1    Aug. 9, 2007

(30) Foreign Application Priority Data

Feb. 8, 2006    (JP)    .............................. 2006-031092

(51) Int. Cl.
*H02H 3/22* (2006.01)
*H02H 1/00* (2006.01)

(52) U.S. Cl. ...................................... 361/117
(58) Field of Classification Search .................. 361/117
See application file for complete search history.

(56) References Cited

U.S. PATENT DOCUMENTS 5,914,662 A * 6/1999 Burleigh ..................... 340/635
6,879,478 B2 * 4/2005 Mendoza et al. ............ 361/93.1

FOREIGN PATENT DOCUMENTS

JP    6-303445 A    10/1994
JP    2004-23576 A    1/2004

* cited by examiner

*Primary Examiner*—Ronald W Leja
(74) *Attorney, Agent, or Firm*—Fujitsu Patent Center

(57) ABSTRACT

A surge detection circuit for determining that the characteristics of an internal circuitry of a chip have deteriorated by surges applied from a sensor to the chip and generating a warning signal. The surge detection circuit is connected to an input terminal and includes a surge detector for detecting surge applied to the input terminal and generating an output signal showing the detection result. A determination unit determines that the characteristics of the input circuit have deteriorated based on the output signal of the surge detector and generates a warning signal based on the determination result.

12 Claims, 3 Drawing Sheets

SURGE DETECTION CIRCUIT

CROSS-REFERENCE TO RELATED APPLICATIONS

This application is based upon and claims the benefit of priority from the prior Japanese Patent Application No. 2006-031092, filed on Feb. 8, 2006, the entire contents of which are incorporated herein by reference.

BACKGROUND OF THE INVENTION

The present invention relates to a surge detection circuit, and more particularly, to a sensor surge detection circuit for detecting surge applied from a sensor to a chip.

Sensors are used in various fields. Sensors have been miniaturized and thus tend to have smaller outputs. Such a sensor is often used together with a detection circuit for detecting the sensor output. The sensor may generate surge when subjected to stress or a sudden temperature change. It is this necessary to prevent the inner circuitry of a chip to which the sensor is connected from being damaged by surges.

FIG. 1 is a schematic circuit block diagram showing surge protection circuits 3a and 3b mounted on a conventional semiconductor chip 4.

A sensor 1 is connected to the semiconductor chip 4 via input terminals 5a and 5b. An output signal of the sensor 1 is provided via input stage amplifiers 2a and 2b, which are mounted on the chip 4, to a circuit in a subsequent stage (not shown).

The surge protection circuit 3a is connected to an input terminal of the amplifier 2a (input terminal 5a). The surge protection circuit 3b is connected to an input terminal of the amplifier 2b (input terminal 5b). The surge protection circuit 3a includes a diode D1, which has an anode connected to the input terminal 5a and a cathode connected to a high potential power supply VDD, and a diode D2, which has a cathode connected to the input terminal 5a and an anode connected to a low potential power supply GND. The surge protection circuit 3b includes a diode D1, which has an anode connected to the input terminal 5b and a cathode connected to a high potential power supply VDD, and a diode D2, which has a cathode connected to the input terminal 5b and an anode connected to a low potential power supply GND.

A high potential surge applied from the sensor 1 to each of the input terminals 5a and 5b is absorbed by the high potential power supply VDD via the diode D1 of each of the surge protection circuits 3a and 3b. A low potential surge applied from the sensor 1 to each of the input terminals 5a and 5b is absorbed by the low potential power supply GND via the diode D2 of each of the surge protection circuits 3a and 3b. As a result, the amplifiers 2a and 2b are protected against surges.

Japanese Laid-Open Patent Publication No. 6-303445 (refer to FIG. 2) describes a horizontal deflection circuit used in a television receiver. The horizontal deflection circuit prevents surges, such as one-shot pulse inputs, from causing erroneous operation or inflicting damage.

Japanese Laid-Open Patent Publication No. 2004-23576 describes an erroneous operation prevention circuit for preventing noise, such as static electricity or surges, from causing erroneous operations. The erroneous operation prevention circuit includes a pulse detection circuit, which detects a pulse (noise) superimposed on an input signal, a pulse extension circuit, which extends the pulse of the detection signal of the pulse detection circuit, and a level holding circuit, to which the detection signal and the input signal are provided.

SUMMARY OF THE INVENTION

The surge protection circuits 3a and 3b normally have a small surge absorption capacity that is just enough to prevent noise, such as parasitic capacitance, from affecting the slight small output voltage of the sensor 1.

However, the sensor 1 may output a surge of several tens to several hundreds voltages in a short period of time when the sensor 1 is subjected to stress or a sudden temperature change. The surge protection circuits 3a and 3b described cannot absorb such a steep surge. This may deteriorate the characteristics of the input-stage amplifiers 2a and 2b and the subsequent-stage circuit or inflict permanent damage on these circuits.

The above publications do not describe a structure for preventing the reliability from being lowered when the characteristics of the internal circuitry of the IC are deteriorated by surges.

The present invention provides a surge detection circuit for determining whether the characteristics of the internal circuitry of a chip have deteriorated by surges that are applied to the chip to generate a warning signal.

One aspect of the present invention is a surge detection circuit connected to an input terminal. The input terminal is further connected to an input circuit. The surge detection circuit includes a surge detector, connected to the input terminal, for detecting surge applied to the input terminal and generating an output signal showing the detection result. A determination unit, connected to the surge detector, determines whether a characteristic of the input circuit has deteriorated based on the output signal of the surge detector and generates a warning signal based on the determination result.

A further aspect of the present invention is a surge detection circuit connected to an input terminal. The input terminal is further connected to a first input circuit. The surge detection circuit includes a second input circuit connected to the input terminal. A level difference detection circuit, connected to the first input circuit and the second input circuit, detects a level difference between an output signal of the first input circuit and an output signal of the second input circuit and generates an output signal showing the detection result. A controller, connected to the level difference detection circuit, generates a warning signal based on the output signal of the level difference detection circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
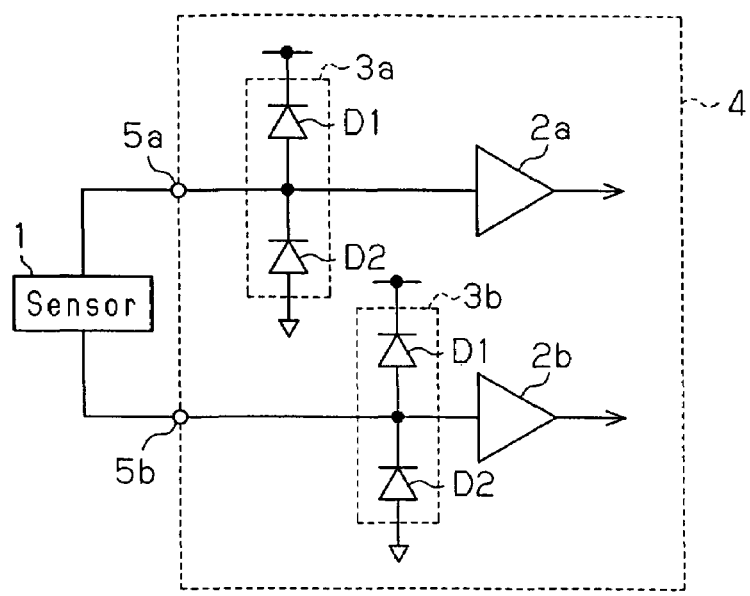
FIG. 1 is a schematic circuit block diagram showing surge protection circuits mounted on a conventional semiconductor chip.

In the drawings, like numerals are used for like elements throughout.

Figure 2:
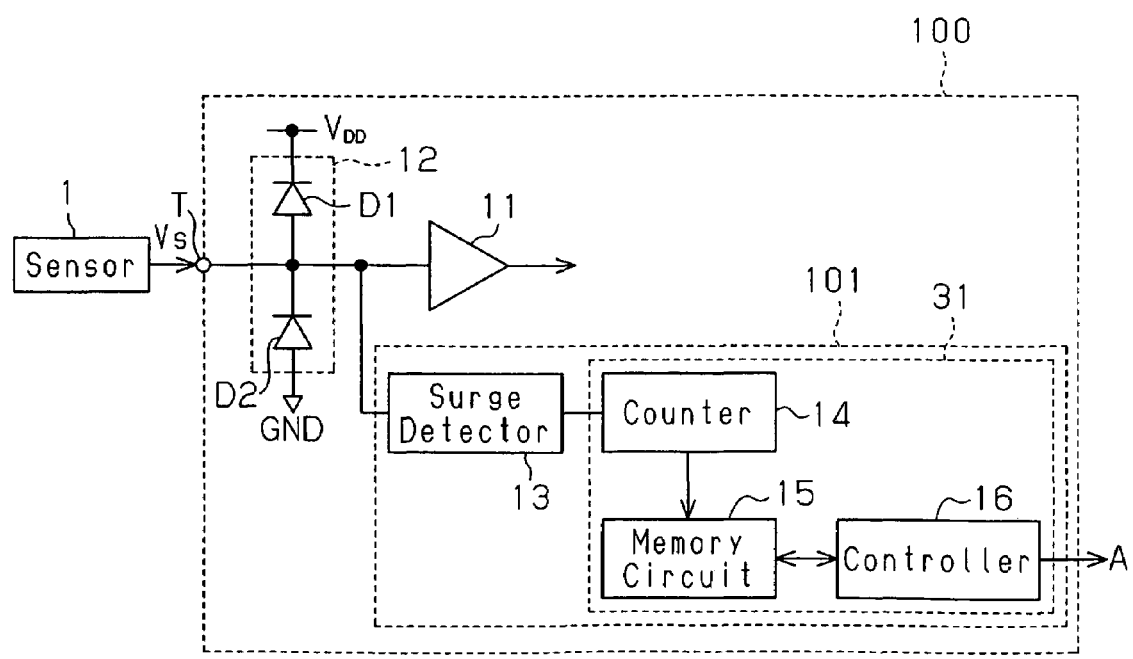
FIG. 2 is a schematic circuit block diagram showing a surge detection circuit mounted on a semiconductor chip according to a first embodiment of the present invention.

FIG. 2 is a schematic circuit block diagram showing a surge detection circuit 101 mounted on a semiconductor chip 100 according to a first embodiment of the present invention. A sensor 1 is connected to an input terminal T of the chip 100. The input terminal T of the chip 100 is connected to an input circuit 11, which is mounted on the chip 100. An output signal Vs of the sensor 1 provided to the input terminal T is further provided to a subsequent stage circuit (not shown) via the input circuit 11.

A surge protection circuit 12 is connected to the input terminal T. The surge protection circuit 12 includes a diode D1, which has an anode connected to the input terminal T and a cathode connected to a high potential power supply VDD, and a diode D2, which has a cathode connected to the input terminal T and an anode connected to a low potential power supply GND. The surge protection circuit 12 functions in the same manner as that in the prior art example described above.

The surge detection circuit 101 is connected to the input terminal T. The surge detection circuit 101 includes a surge detector 13, a counter 14, a memory circuit 15, and a controller 16. The counter 14, the memory circuit 15, and the controller 16 form a determination unit 31.

The surge detector 13 detects surge (voltage exceeding a predetermined value) applied to the input terminal T and provides the counter 14 with a pulse signal indicating the detection result. The counter 14 accumulates the provided pulse signals (number of pulses) and provides the accumulated value to the memory circuit 15.

The memory circuit 15, which includes a nonvolatile memory, stores the accumulated value provided from the counter 14.

The controller 16 is connected to the memory circuit 15. The controller 16 reads the accumulated value stored in the nonvolatile memory. When the accumulated value reaches a preset warning value, which shows deterioration in the characteristics of the input circuit 11, the controller 16 detects that the characteristics of the input circuit 11 have deteriorated and generates a warning signal A. The warning signal A is provided, for example, to a microcomputer chip (not shown) via an external pin (not shown).

The surge detection circuit 101 detects surge applied to the input terminal T with the surge detector 13, accumulates the number of times surges are detected with the counter 14, and stores the accumulated value in the memory circuit 15. The warning signal A is generated by the controller 16 when the accumulated value stored in the memory circuit 15 reaches the warning value.

The surge detection circuit 101 of the first embodiment has the advantages described below.

Surge applied to the input circuit 11 is detected so that when the accumulated value showing the number of times surges are detected reaches the warning value, a warning signal A is generated. This enables an external device (e.g., a microcomputer chip), which receives the warning signal A, to recognize that the characteristics of the input circuit 11 or the subsequent-stage circuit have deteriorated or may deteriorate.

The accumulated value is stored in the nonvolatile memory of the memory circuit 15. Thus, even when the power supply of the surge detection circuit 101 is cut, the stored accumulated value remains held. Accordingly, irrespective of whether the power supply to the surge detection circuit 101 is cut, the accumulated value is accurately accumulated from when the surge detection circuit 101 is first used.

When a nonvolatile memory used for other purposes is mounted on the chip 100 that includes the surge detection circuit 101, this nonvolatile memory may be used as the memory circuit 15.

Figure 3:
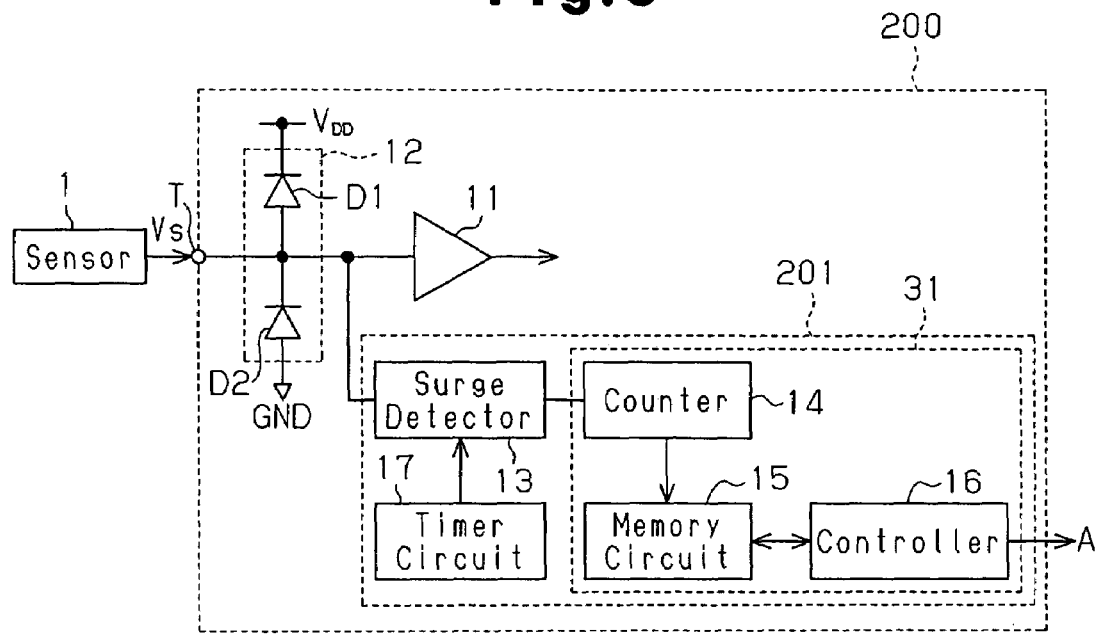
FIG. 3 is a schematic circuit block diagram showing a surge detection circuit mounted on a semiconductor chip according to a second embodiment of the present invention.

FIG. 3 is a schematic circuit block diagram showing a surge detection circuit 201 mounted on a semiconductor chip 200 according to a second embodiment of the present invention. In the second embodiment, a timer circuit 17 is connected to a surge detector 13.

The timer circuit 17 is used to control the surge detector 13 to operate during a predetermined time period, which is set in advance. In other words, the timer circuit 17 sets the operation time of the surge detector 13. Thus, a memory circuit 15 stores an accumulated value showing the number of times surges are detected during the predetermined period set by the timer circuit 17. A controller 16 generates a warning signal A when the accumulated value reaches a warning value.

In the second embodiment, when the number of times surges are detected during the period set for the timer circuit 17 reaches the warning value, a warning signal A is generated.

Figure 4:
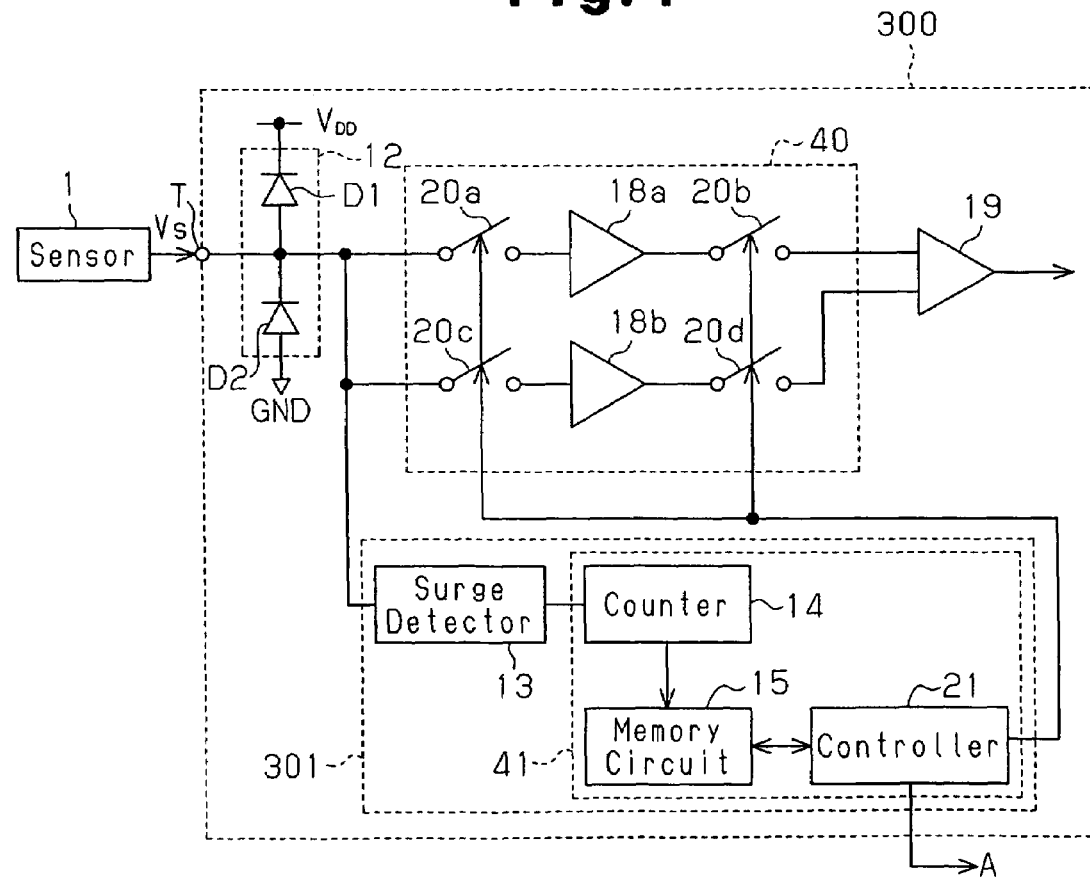
FIG. 4 is a schematic circuit block diagram showing a surge detection circuit mounted on a semiconductor chip according to a third embodiment of the present invention.

FIG. 4 is a schematic circuit block diagram showing a surge detection circuit 301 mounted on a semiconductor chip 300 according to a third embodiment of the present invention. In the third embodiment, an input circuit 40 includes two input circuits 18a and 18b and four switches 20a, 20b, 20c, and 20d. Further, the controller 16 in the first and second embodiments (refer to FIGS. 2 and 3) are replaced by a controller 21. A counter 14, a memory circuit 15, and the controller 21 form a determination unit 41.

The input circuits 18a and 18b are connected in parallel between an input terminal T and a subsequent-stage circuit 19. In detail, the input circuit 18a is connected to the input terminal T via the switch 20a and connected to the subsequent-stage circuit 19 via the switch 20b. The input circuit 18b is connected to the input terminal T via the third switch 20c and connected to the subsequent-stage circuit 19 via the switch 20d. The switches 20a to 20d are turned on and off by the controller 21.

When the surge detection circuit 301 is activated, the switches 20a and 20b are turned on and the switches 20c and 20d are turned off. More specifically, the input circuit 18a is connected to the input terminal T and to the subsequent-stage circuit 19. In this state, the number of times a surge is detected is counted by the counter 14. Next, when the accumulated value reaches a first value, the controller 21 turns off the switches 20a and 20b and turns on the switches 20c and 20d. More specifically, the input circuit 18b is connected to the input terminal T and to the subsequent-stage circuit 19. The first value is set to show that the characteristics of the input circuit 18a have deteriorated by repeated input surges.

After the switches 20c and 20d are turned on, the number of times a surge is detected is continuously counted by the counter 14. Next, when the accumulated value reaches a second value (warning value), which is greater than the first value, the controller 21 turns off the switches 20c and 20d. The controller 21 keeps the switches 20a and 20b turned off. As a result, neither one of the input circuits 18a nor 18b are connected to the input terminal T and to the subsequent-stage circuit 19. In this case, the controller 21 generates a warning signal A.

The surge detection circuit 301 of the third embodiment has the advantage described below in addition to the advantages described in the first embodiment.

The surge detection circuit 301 sequentially connects the input circuits 18a and 18b to the input terminal T in accordance with the number of times a surge is detected. This prolongs the life of the input circuit 40.

Figure 5:
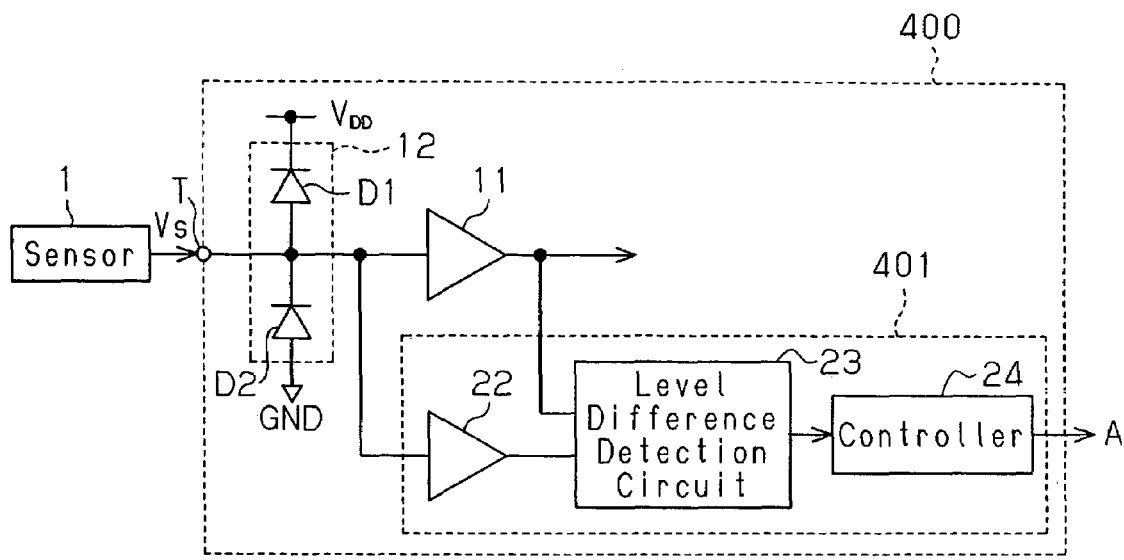
FIG. 5 is a schematic circuit block diagram showing a surge detection circuit mounted on a semiconductor chip according to a fourth embodiment of the present invention.

FIG. 5 is a schematic circuit block diagram showing a surge detection circuit 401 mounted on a semiconductor chip 400 according to a fourth embodiment of the present invention. The surge detection circuit 401 of the fourth embodiment includes a second input circuit 22, a level difference detection circuit 23, and a controller 24 for detecting deterioration in the characteristics of an input circuit 11 (hereafter referred to as a first input circuit 11) due to surges. The first and second input circuits 11 and 22 have substantially identical structures.

The first input circuit 11 and the second input circuit 22 are connected to the input terminal T. An output signal of the first input circuit 11 and an output signal of the second input circuit 22 are provided to the level difference detection circuit 23. The level difference detection circuit 23 detects the level difference between the output signals of the input circuits 11 and 22 and provides the detection value to the controller 24.

The controller 24 detects deterioration in the characteristics of the first input circuit 11 when the provided detection value reaches a preset warning value, which shows deterioration in the characteristic of the first input circuit 11. In this case, the controller 24 generates a warning signal A.

The distance between the second input circuit 22 and the input terminal T is set so that surges may be sufficiently attenuated and in order to prevent the characteristics of the second input circuit 22 from being deteriorated by surges.

The surge detection circuit 401 of the fourth embodiment has the advantage described below.

The surge detection circuit 401 detects that the characteristics of the first input circuit 11 have deteriorated using the second input circuit 22, which has the same structure as the first input circuit 11, and the level difference detection circuit 23. Thus, the surge detection circuit 401 detects that the characteristics of the first input circuit 11 have deteriorated and generates a warning signal A even though the chip 400 does not have the memory circuit 15 (FIGS. 2 to 4).

Figure 6:
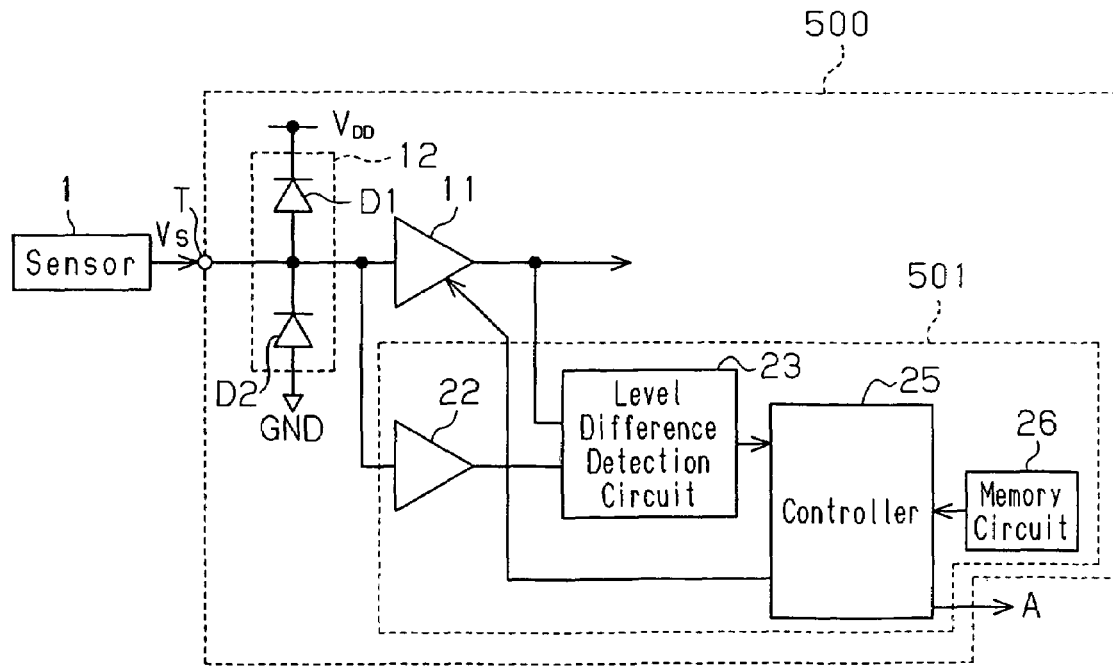
FIG. 6 is a schematic circuit block diagram showing a surge detection circuit mounted on a semiconductor chip according to a fifth embodiment of the present invention.

FIG. 6 is a schematic circuit block diagram showing a surge detection circuit 501 mounted on a semiconductor chip 500 according to a fifth embodiment of the present invention. The surge detection circuit 501 of the fifth embodiment functions to correct the operation characteristics of a first input circuit 11 based on an output signal of a level difference detection circuit 23, which is identical to the level difference detection circuit 23 of the fourth embodiment.

The output signal of the level difference detection circuit 23 is provided to a controller 25. Further, a memory circuit 26 is connected to the controller 25. The memory circuit 26 includes a nonvolatile memory. The memory circuit 26 stores a correction table for correcting the gain or offset value of the input circuit 11 in accordance with the level difference between an output signal of the first input circuit 11 and an output signal of a second input circuit 22.

The controller 25 reads a correction value from the memory circuit 26 based on the output signal of the level difference detection circuit 23 and adjusts the gain or offset value of the first input circuit 11 in accordance with the correction value. In this way, the controller 25 reduces the level difference between the output signals of the first input circuit 11 and the second input circuit 22.

Then, the controller 25 generates a warning signal A when a detection value indicating a level difference that is greater than or equal to a warning value is received from the level difference detection circuit 23 after the controller 25 adjusts the gain or the offset value of the first input circuit 11.

The surge detection circuit 501 of the fifth embodiment has the advantage described below in addition to the advantage described in the fourth embodiment.

The controller 25 corrects the operation characteristics of the first input circuit 11 by adjusting the gain or offset value of the first input circuit 11. This prolongs the life of the first input circuit 11.

It should be apparent to those skilled in the art that the present invention may be embodied in many other specific forms without departing from the spirit or scope of the invention. Particularly, it should be understood that the present invention may be embodied in the following forms.

The surge detection circuit 301 of the third embodiment may include the timer circuit 17 of the second embodiment.

The input circuit 40 of the third embodiment may include three or more input circuits that are arranged in parallel. In this case, it is preferable that the controller 21 have three or more values for switching the input circuits and generating a warning signal A.

The input circuit 40 of the third embodiment does not have to include the switches 20b and 20d.

In the fourth embodiment, a plurality of input circuits 11 may be connected to the input terminal T via separate switches, and the controller 24 may sequentially connect each of the plurality of input circuits 11 to the input terminal T based on the output signal of the level difference detection circuit 23 in the same manner as in the third embodiment. The fifth embodiment may also be modified in the same manner.

The memory circuit 26 in the fifth embodiment may be replaced by a nonvolatile memory that is mounted on the chip 500 for other purposes in the same manner as in the first, second, and third embodiments.

The present examples and embodiments are to be considered as illustrative and not restrictive, and the invention is not to be limited to the details given herein, but may be modified within the scope and equivalence of the appended claims.

What is claimed is:

1. A surge detection circuit coupled to an input terminal, wherein the input terminal is further coupled to an input circuit, the surge detection circuit comprising:

a surge detector, coupled to the input terminal, to detect a surge applied to the input terminal and generate an output signal indicating the detection result; and a determination unit, coupled to the surge detector, which includes:

a counter to count the number of times the surge is detected by the surge detector based on the output signal of the surge detector;

a memory to store an accumulated value of the detected number of times counted by the counter; and a controller to determine whether a characteristic of the input circuit has deteriorated based on the accumulated value and generate a warning signal based on the determination result, wherein the input circuit includes:

a plurality of parallel coupled switches connected to the input terminal; and a plurality of input circuits respectively connected in series to the plurality of switches;

wherein the controller connects the plurality of input circuits to the input terminal by selectively turning the plurality of switches on and off based on the accumulated value.

2. The surge detection circuit according to claim 1, further comprising:
a timer circuit, connected to the surge detector, to set an operation time of the surge detector.

3. The surge detection circuit according to claim 1, wherein the controller generates the warning signal when the accumulated value reaches a warning value indicating deterioration in the characteristic of the input circuit.

4. The surge detection circuit according to claim 1, wherein the memory includes a nonvolatile memory.

5. The surge detection circuit according to claim 1, wherein:
the plurality of switches include a first switch and a second switch;
the plurality of input circuits include a first input circuit connected to the first switch and a second input circuit connected to the second switch; and
the controller turns on the first switch and turns off the second switch when the surge detection circuit is activated, the controller turns off the first switch and turns on the second switch when the accumulated value reaches a first value, and the controller turns off the first switch and the second switch and generates the warning signal when the accumulated value reaches a second value that is greater than the first value.

6. A surge detection circuit connected to an input terminal, wherein the input terminal is further connected to a first input circuit, the surge detection circuit comprising:
a second input circuit connected to the input terminal;
a level difference detection circuit, connected to the first input circuit and the second input circuit, to detect a level difference between an output signal of the first input circuit and an output signal of the second input circuit and generate an output signal showing the detection result; and
a controller, connected to the level difference detection circuit, to generate a warning signal based on the output signal of the level difference detection circuit.

7. The surge detection circuit according to claim 6, wherein the first and second input circuits have substantially the same structure.

8. The surge detection circuit according to claim 6, wherein the controller generates the warning signal when the output signal of the level difference detection circuit reaches a warning value showing deterioration in the characteristic of the first input circuit.

9. The surge detection circuit according to claim 6, wherein distance between the second input circuit and the input terminal is set to sufficiently attenuate a surge and prevent the surge from deteriorating the characteristic of the second input circuit.

10. The surge detection circuit according to claim 6, further comprising:
a memory circuit, connected to the controller, and including a correction table to correct an operation characteristic of the first input circuit;
wherein the controller corrects the operation characteristic of the first input circuit based on the output signal of the level difference detection circuit and the correction table.

11. The surge detection circuit according to claim 10, wherein the controller corrects the operation characteristic of the first input circuit by adjusting a gain or an offset value of the first input circuit.

12. The surge detection circuit according to claim 10, wherein the memory circuit includes a nonvolatile memory.

* * * * *